United States Patent
Allen et al.

(10) Patent No.: US 8,138,054 B2
(45) Date of Patent: Mar. 20, 2012

(54) ENHANCED FIELD EFFECT TRANSISTOR

(75) Inventors: David Howard Allen, Rochester, MN (US); Todd Alan Christensen, Rochester, MN (US); David Paul Paulsen, Dodge Center, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 12/416,264

(22) Filed: Apr. 1, 2009

(65) Prior Publication Data
US 2010/0252868 A1    Oct. 7, 2010

(51) Int. Cl.
*H01L 21/336* (2006.01)

(52) U.S. Cl. .. 438/300; 438/478; 257/287; 257/E21.634

(58) Field of Classification Search ............... 257/241, 257/268, 287, E21.634, E21.618; 438/300, 438/478
See application file for complete search history.

(56) References Cited

U.S. PATENT DOCUMENTS

| | | | |
|---|---|---|---|
| 5,012,306 | A | 4/1991 | Tasch, Jr. et al. |
| 5,093,275 | A | 3/1992 | Tasch, Jr. et al. |
| 5,312,768 | A | 5/1994 | Gonzalez |
| 7,002,207 | B2 * | 2/2006 | Kim et al. ............ 257/331 |
| 7,355,237 | B2 | 4/2008 | Lutze et al. |
| 7,560,379 | B2 | 7/2009 | Kohli et al. |
| 7,713,828 | B2 | 5/2010 | Yuki |
| 2006/0252191 | A1 | 11/2006 | Kammler et al. |
| 2007/0184572 | A1 | 8/2007 | Kohli et al. |
| 2009/0114997 | A1 | 5/2009 | Tong et al. |
| 2009/0224368 | A1 | 9/2009 | Sudo |

* cited by examiner

*Primary Examiner* — Matthew Landau
*Assistant Examiner* — Candice Chan
(74) *Attorney, Agent, or Firm* — Robert R. Williams

(57) ABSTRACT

An enhanced FET capable of controlling current above and below a gate of the FET. The FET is formed on a semiconductor substrate. A source and drain are formed in the substrate (or in a well in the substrate). A first epitaxial layer of similar doping to the source and drain are grown on the source and drain, the first epitaxial layer is thicker than the gate, but not so thick as to cover the top of the gate. A second epitaxial layer of opposite doping is grown on the first epitaxial layer thick enough to cover the top of the gate. The portion of the second epitaxial layer above the gate serves as a body through which the gate controls current flow between portions of the first epitaxial layer over the drain and the source.

4 Claims, 3 Drawing Sheets

Growth of oxide over STI regions, planarization by chemical/mechanical polishing Creation of S/D regions, Gate with top & bottom gate dielectrics, spacers to isolate gate Beginning of N+ Epi growth over S/D regions Completion of N+ Epi growth over S/D regions Growth of P- Epi over N+ Epi, sufficient to cover second gate oxide Growth of oxide over STI regions, planarization by chemical/mechanical polishing

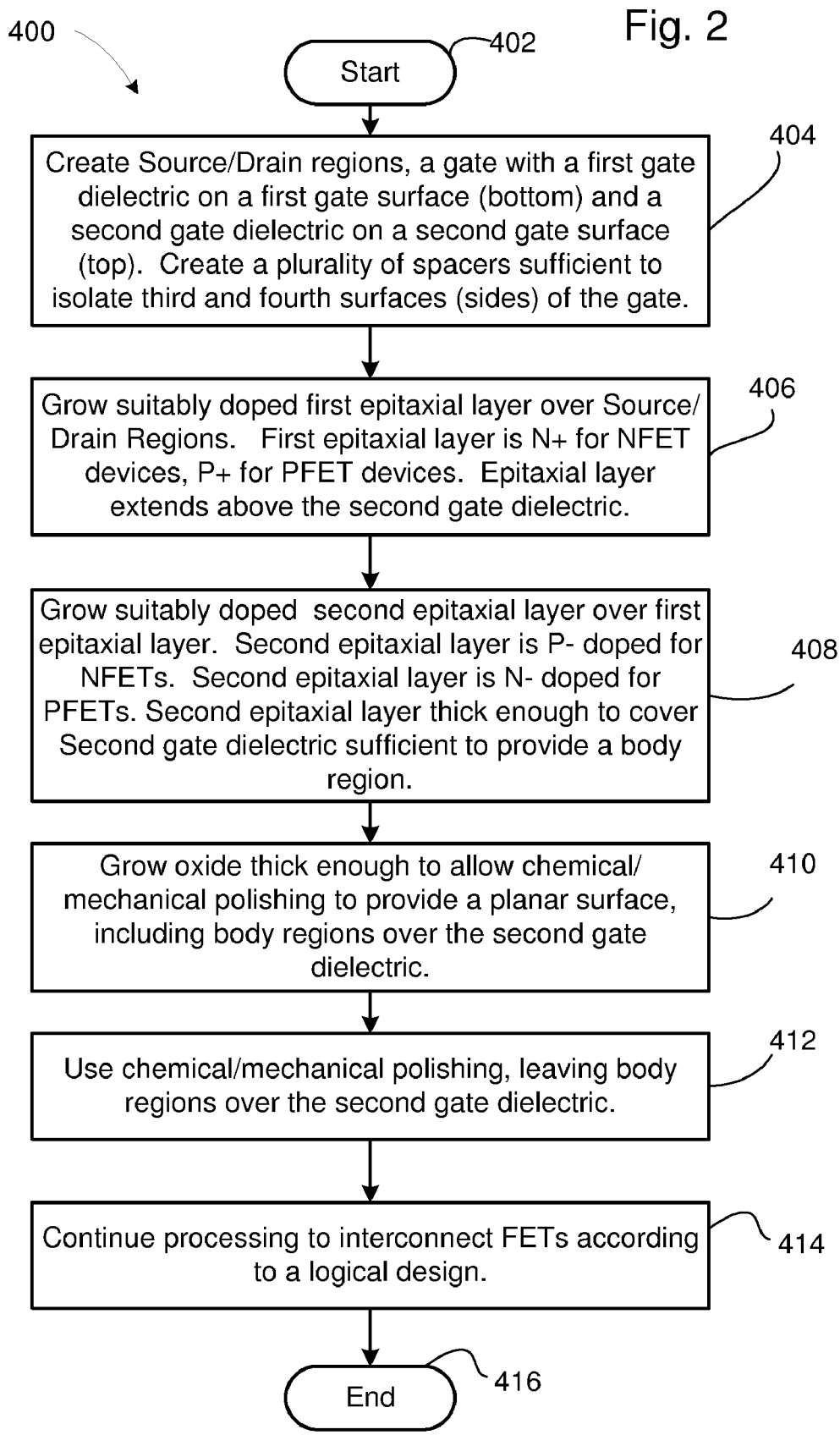

ENHANCED FIELD EFFECT TRANSISTOR

FIELD OF THE INVENTION

This invention relates generally to Field Effect Transistors (FETs), and more particularly to FETs with enhanced drive capability.

SUMMARY OF EMBODIMENTS OF THE INVENTION

A Field Effect Transistor (FET) conducts a current that is proportional to a gate width of the FET through a channel in a FET body that is typically in a body area between source and drain in a semiconductor substrate or a body area in a suitably doped and biased well.

In an embodiment of the present invention, an enhanced FET is created on a semiconductor substrate. The enhanced FET comprises a gate having a first gate dielectric on a first (bottom) surface of the gate and a second gate dielectric on a second (top) surface of the gate; the first and second surfaces being parallel with the semiconductor substrate. Vertical (perpendicular with respect to the semiconductor substrate) third and fourth surfaces of the gate are electrically isolated. A source and drain are provided in the semiconductor substrate suitable for forming a first channel between the source and drain when the gate is suitably biased. A first epitaxial layer is formed from the source and drain that is higher than the top of the second gate dielectric. The first epitaxial layer has a doping similar to that of the drain and source doping. A second epitaxial layer having an opposite doping, such as if the first epitaxial layer is doped N+, the second epitaxial layer may be doped P– is grown from the first epitaxial layer and is grown until the second epitaxial layer covers a top surface of the second gate dielectric sufficiently to allow a second channel to be formed between the first epitaxial layer over the source and the first epitaxial layer over the drain. Upon placing suitable voltages on the gate, source, and drain, current will flow through both the first and second channel.

BRIEF DESCRIPTION OF THE DRAWINGS

FIG. 2 shows a method for making the enhanced FET.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for an enhanced FET having improved current drive. The enhanced FET has a gate capable of controlling drain-source current both above the gate and below the gate.

Figure 1A:
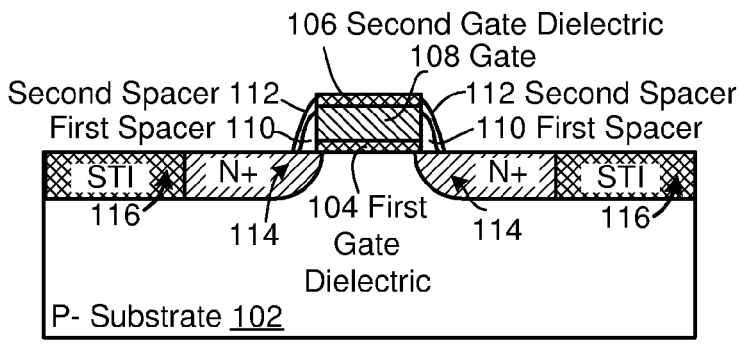
FIG. 1A is a figure of a stage in a semiconductor process for making an enhanced FET having improved current conduction characteristics, the process shown after completion of creation of source/drain regions, a gate having gate oxide on top and bottom surfaces of the gate, and creation of spacers.

FIG. 1A shows a P– substrate 102 after several processing steps. In particular, shallow trench isolation (STI) regions 116, source/drain regions 114, a gate 108, a first gate dielectric 104, and a second gate dielectric 106 on top of gate 108 are formed in conventional fashion known to those skilled in the art. For example, the STI regions 116 are formed; then the first gate dielectric material is deposited across the top of the semiconductor substrate; then metal is deposited, the metal, after etching, will become gate 108. Then a second gate dielectric material is deposited. A mask protects the "vertical stack" of first gate dielectric 104, gate 108, and second gate dielectric 106 where the FET gate is to be located from subsequent etching steps. A first etch removes all of the second gate dielectric material except under the mask, i.e., at second gate dielectric 106. A second etch removes all of the metal except under the mask, i.e., gate 108. A third etch removes all of the first dielectric material except under the mask, i.e., first gate dielectric 104.

Source/Drain regions 114 are created using convention semiconductor processing, e.g., diffusion or implanting steps.

A plurality of spacers, e.g., first spacer 110 and second spacer 112 are formed on both vertical sides of gate 108 through known techniques. For example, an oxide is conformally deposited over a top surface of structures (STI 116, source/drain regions 114, and second gate oxide 106. The oxide is then isotropically etched, leaving the spacers on the vertical sides of gate 108, first gate dielectric 104, and at least some of a vertical surface of second gate dielectric 106. First spacer 110 and second spacer 112 electrically isolate the vertical sides of gate 108 from future conducting material (doped epitaxial growth) grown above source/drain regions 114. Although first spacer 110 and second spacer 112 are shown, additional spacers may be required in a given technology to ensure complete electrical isolation of the vertical sides of gate 108.

Figure 1B:
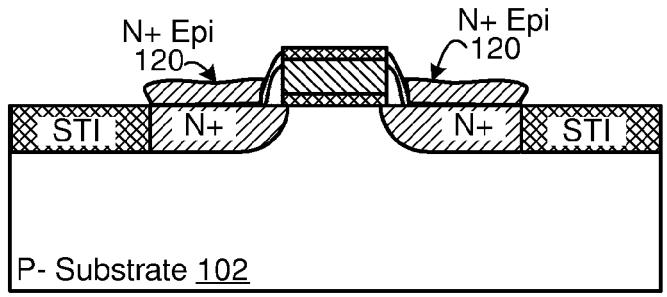
FIG. 1B shows the semiconductor process of FIG. 1A further including a partial creation of a first epitaxial layer comprising epitaxial growths of a first type over the source/drain regions.

FIG. 1B illustrates an early stage in growing a first epitaxial layer, N+ Epi 120, which is an N+ epitaxial area grown over N+ source/drain regions 114 (for simplicity, reference numerals are in general not repeated during the process flow shown in FIGS. 1A-1E). The FET depicted is an N-channel FET, known as an NFET, having N+ source and drain regions (source/drain regions 114) in a P– substrate. P– substrate 102 may also contain P-channel FETs (PFETs), comprising P+ source/drain regions created in an N-well created in P– substrate 102. Creation of PFETs in N-wells are well understood and not drawn herein. First epitaxial layer for a PFET requires P+ epitaxial growth from the P+ source drain regions. N+ epitaxial growth for NFETs and P+ epitaxial growths for PFETs are performed separately, with suitable masking.

Figure 1C:
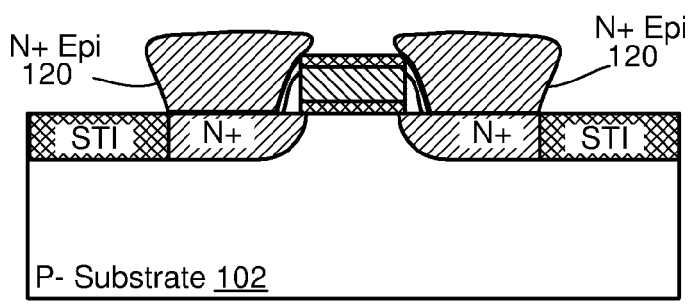
FIG. 1C shows the semiconductor process of FIG. 1B upon completion of creation of the first epitaxial layer.

FIG. 1C illustrates completion of growth of the first epitaxial layer comprising first N+ Epi 120 over source/drain regions 114 for the NFET depicted for exemplary purposes. A PFET would have a similar first epitaxial layer comprising P+ epitaxial growth, as will be understood by those of skill in the art. It will be noted that N+ Epi 120 extends above second gate dielectric 106. First spacer 110 and second spacer 112 prevent N+ Epi 120 from short circuiting to gate 108.

Figure 1D:
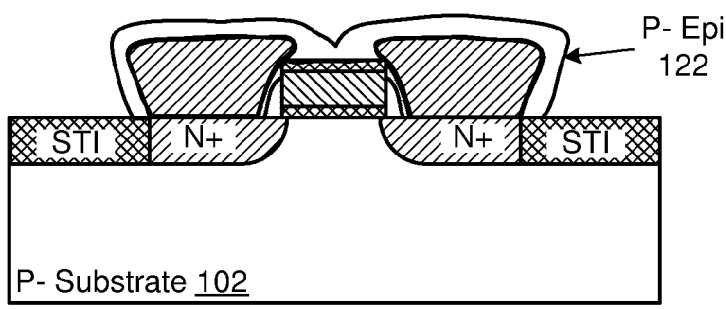
FIG. 1D shows the semiconductor process of FIG. 1C upon completion of grown of a second epitaxial layer comprising epitaxial growths of a second type.

FIG. 1D illustrates a second epitaxial layer P− Epi 122 which is grown over first N+ Epi 120. P− Epi 122 has a doping similar to that of P− substrate 102. P− Epi 122 is grown thick enough to spread out from N+ Epi 120 to completely cover second gate dielectric 106 deep enough to provide for an FET body above the second gate dielectric 106. As will be understood, the second epitaxial layer for a PFET would be N− epitaxial growth, which would need to be grown thick enough to spread out from the PFET's P+ epitaxial growths to cover the second gate dielectric of the PFET deep enough to provide an FET body above the second gate dielectric of the PFET.

Figure 1E:
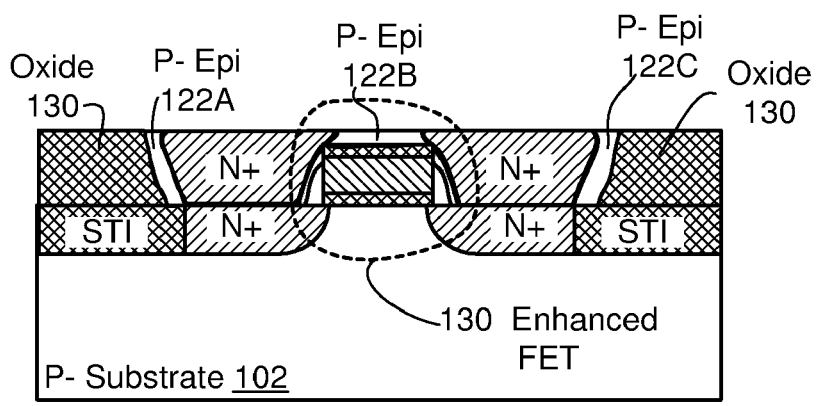
FIG. 1E shows the semiconductor process of FIG. 1D upon completion of oxide growth over shallow trench isolation regions and the epitaxial growths of the second types, and further completion of planarization by, e.g., chemical/mechanical polishing.

FIG. 1E shows the structure of FIG. 1D after growing an oxide 130 over STI 116 areas, and over the second epitaxial layer, completing enhanced FET 130. Planarization has been performed, using chemical/mechanical polishing or other planarization technique. Planarization has removed most of the second epitaxial layer. For the NFET depicted, remnants of the second epitaxial layer include P− Epi 122A, 122B, and 122C. P− Epi 122B forms an FET body over second gate dielectric 106, so that gate 108 can control current flow in P− Epi 122B (a "top channel"). For example, again using the NFET structure depicted, when gate 108 has a "high" voltage applied, current flows through P− Epi 122B between the N+ Epis 120 grown over, and electrically connected to, source/drain areas 114. At the same time, the applied high voltage on gate 108 causes current to flow in a "bottom channel" between source/drain regions 114 in the FET comprising source drain regions 114, gate 108, first gate dielectric 104, and body P− substrate 102. As will be understood, PFETs constructed using similar techniques with suitably doped first and second epitaxial layers also control current through two channels controlled by a single gate.

P− Epi 122B is not connected to a bias voltage and "floats" based on leakage and junction voltages of the source/drain epitaxial growths 120. Voltage of P− Epi 122B behaves as a floating body of a silicon on insulator (SOI) FET.

The structure produced is a dual-channel, single-gate enhanced FET 130 having enhanced drive capabilities versus a single-channel, single-gate FET. Assuming equivalent current flow (when turned "ON" by the gate) in the top channel and in the bottom channel, the enhanced FET 130, having a physical channel width of "N", has an electrical channel width of "2*N".

FIG. 2 is a flow diagram of a method 400 for constructing the enhanced FET. Method 400 begins at block 402.

In block 404, Shallow Trench Isolation (STI) areas are formed in a substrate. A first thin oxide is deposited on a top surface of a semiconductor substrate, i.e., the thin oxide used for first gate dielectric 104 in FIG. 1A. A metal layer is deposited over the first thin oxide layer, suitable for a gate (e.g., gate 108 of FIG. 1A). A second thin oxide is deposited over the top of the metal layer. A mask defines where the FET gate is to be. A first etch removes all of the second thin oxide except under the mask, leaving second gate dielectric 106 (FIG. 1A). A second etch removes the entire metal layer except gate 108. A third etch removes the entire first thin oxide layer except first gate dielectric 104.

Source/Drain regions are formed by implant or diffusion processes. N+ source/drain regions in a P− substrate form the source/drain regions for NFETs. A PFET requires an N-well be formed, the thin oxide deposited thereupon; a gate created; portions of the thin oxide not covered by the gate removed, and then the PFET source/drain regions are formed by implanting or diffusing P+ material. The P+ source/drain regions in the N-well form the source/drain regions for the PFET.

A plurality of spacers are formed on vertical sides of the gate to electrically isolate vertical (that is, perpendicular to the plane of the semiconductor substrate) sides of the gate from subsequent epitaxial growths. A spacer may be formed by depositing a conformal oxide layer and isotropically etching the conformal layer. Typically, two or more spacers are required to ensure electrical isolation of the vertical sides of the gate.

In block 406, a first epitaxial layer (N+ for NFETs, P+ for PFETS) is grown over drain/source regions. Epitaxial growth is performed until the first epitaxial layer extends above the gate and the second gate dielectric enough to be suitable for functioning as source/drain regions associated with the second gate dielectric.

In block 408, a second epitaxial layer (P− for NFETs, N− for PFETS) is grown over the first epitaxial layer. NFET regions must be masked during growth of the second epitaxial layer (N−) for PFETs; PFET regions must be masked during growth of the second epitaxial layer (P−) for NFETs. The second epitaxial layer must be thick enough such that the second epitaxial layer fills the void above the second gate dielectric and is thick enough over the second gate dielectric to be suitable as an FET body.

In block 410, an oxide layer is grown that is thick enough to allow subsequent planarization by a process such as chemical/mechanical polishing. For example, the oxide layer has to be at least as thick as depicted in FIG. 1E as oxide 130. The oxide would also grow over the second epitaxial layer, forming a nonplanar structure.

In block 412, planarization, using chemical/mechanical polishing or other process is performed. Substantially all of the second epitaxial layer is removed except (as shown in FIG. 1E) above the second gate dielectric and between remaining portions of the first epitaxial layer. Some portions of the second epitaxial layer will also remain between remaining portions of the first epitaxial layer and the oxide that was grown in block 410 (i.e., P− Epi 122A, 122C, and corresponding N− Epis for PFETs). As depicted in FIG. 1E, the portions of the second epitaxial layer between the oxide grown in block 410 and the remaining portions of the first epitaxial layer are substantially vertical to the plane of P− substrate 102 and these substantially vertical portions of the second epitaxial layer are at distal sides of the first epitaxial layer relative to the portion of the second epitaxial layer over the second gate dielectric. "Substantially vertical" is not perfectly vertical, as the first epitaxial layer (N+ Epi 120 will grow outward over STI 116 slightly, as shown in FIG. 1C). As shown in FIG. 1D, the second epitaxial layer P− Epi 122 grows from N+ Epi 120 and therefore the "substantially vertical" portion of P− Epi 122 is also not completely vertical. "Substantially vertical" is merely a convenient term to distinguish remaining portions of the second epitaxial layer on distal sides of the remaining first epitaxial layer from the remaining portion of the second epitaxial layer over the second gate dielectric.

At this stage of the process, an enhanced FET has been created, the enhanced FET has a single gate; the single gate has a first gate dielectric on a first (bottom) surface of the gate and a second gate dielectric on a second (top) surface of the gate. Suitable voltage applied to the gate forms a first channel between the source/drain regions in the substrate and a second channel between extended (via the first epitaxial layer) source/drain regions and the remaining second epitaxial layer above the second gate oxide.

In block 414, conventional additional process blocks are performed to interconnect FETs to perform desired logical functions. For example, an oxide would be formed over the planarized top surface shown in FIG. 1E, contact holes would be etched to provide for contacts to source/drain regions and gates, conducting materials would be deposited to fill the contact holes, making contacts. Metal (or other suitable conductor) would be deposited to suitably interconnect the contacts. Additional oxide deposition, hole etching, hole filling, and wiring interconnection is then formed in a conventional manner.

Block 416 ends method 400.

What is claimed is:

1. A method for creating an enhanced FET comprising:
   creating a gate having a first gate dielectric on a first surface of the gate and a second gate dielectric on a second surface of the gate, the first and second surfaces of the gate being parallel to a semiconductor substrate;
   creating source/drain regions in the semiconductor substrate;
   electrically isolating a third surface of the gate and a fourth surface of the gate, the third and fourth surfaces of the gate being perpendicular to the semiconductor substrate;
   growing a first epitaxial layer from the source/drain regions, the first epitaxial layer being doped similarly to the source/drain regions, the first epitaxial layer grown high enough to extend above the second gate dielectric;
   growing a second epitaxial layer from the first epitaxial layer, the second epitaxial layer being doped opposite the first epitaxial layer, the second epitaxial layer covering a top surface of the second gate dielectric;
   growing an oxide over shallow trench isolation regions on the semiconductor substrate and over the second epitaxial layer; and
   performing a planarization that separates a portion of the second epitaxial layer over the top surface of the second gate dielectric from substantially vertical portions of the second epitaxial layer on distal sides of the first epitaxial layer.

2. The method of claim 1 wherein electrically isolating the third surface of the gate and the fourth surface of the gate comprises creating one or more spacers on the third surface of the gate and the fourth surface of the gate.

3. The method of claim 1 wherein the semiconductor substrate is doped P−, the first epitaxial layer is doped N+ and the second epitaxial layer is doped P−.

4. The method of claim 1 further comprising:
   creating an N-well in the semiconductor substrate; and
   forming the source/drain regions in the N-well;
   wherein the N-well is doped N−, the source/drain regions are doped P+, the first epitaxial layer is doped P+, and the second epitaxial layer is doped N−.

* * * * *